United States Patent
Huang (10) Patent No.: US 10,978,120 B2
(45) Date of Patent: Apr. 13, 2021

(54) MEMORY INTERFACE CIRCUIT, MEMORY STORAGE DEVICE AND SIGNAL GENERATION METHOD

(71) Applicant: PHISON ELECTRONICS CORP., Miaoli (TW)

(72) Inventor: Ming-Chien Huang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/565,407

(22) Filed: Sep. 9, 2019

(65) Prior Publication Data

US 2021/0027820 A1 Jan. 28, 2021

(30) Foreign Application Priority Data

Jul. 24, 2019 (TW) .................................. 108126253

(51) Int. Cl.
*G11C 7/22* (2006.01)
*G11C 11/40* (2006.01)
(Continued)

(52) U.S. Cl.
CPC .............. *G11C 7/227* (2013.01); *G11C 7/222* (2013.01); *G11C 11/408* (2013.01);
(Continued)

(58) Field of Classification Search
CPC ..... G11C 7/227; G11C 11/4076; G11C 7/222; G11C 11/408; G11C 11/4093;
(Continued)

(56) References Cited

U.S. PATENT DOCUMENTS 6,671,787 B2 12/2003 Kanda et al.
9,754,649 B2 * 9/2017 Shin .................... G11C 7/1045
(Continued)

FOREIGN PATENT DOCUMENTS

TW        344069    11/1998
TW     201442027    11/2014

OTHER PUBLICATIONS

"Office Action of Taiwan Counterpart Application", dated Aug. 31, 2020, p. 1-p. 5.
(Continued)

*Primary Examiner* — Ajay Ojha
(74) *Attorney, Agent, or Firm* — JCIPRNET (57) ABSTRACT

A memory interface circuit, a memory storage device and a signal generation method are provided. The memory interface circuit is configured to connect a volatile memory module and a memory controller. The memory interface circuit includes a clock generation circuit, a first interface circuit and a second interface circuit. The clock generation circuit is configured to provide a reference clock signal. The first interface circuit is configured to provide an address signal to the volatile memory module based on a first transition point of the reference clock signal. The second interface circuit is configured to provide a command signal to the volatile memory module based on a second transition point of the reference clock signal. The first transition point is one of a rising edge and a falling edge of the reference clock signal. The second transition point is the other one of the rising edge and the falling edge of the reference clock signal.

25 Claims, 5 Drawing Sheets

(51) Int. Cl.
*G11C 11/4096* (2006.01)
*G11C 11/408* (2006.01)
*G11C 11/4093* (2006.01)
*G11C 11/4076* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ..... G11C 11/4096; G11C 7/22; G11C 29/023; G06F 13/1689; G06F 3/0659; G06F 13/1668
See application file for complete search history.

(56) References Cited

U.S. PATENT DOCUMENTS

| | | | | |
|---|---|---|---|---|
| 2013/0275830 | A1* | 10/2013 | Park | H03M 13/05 714/758 |
| 2014/0016404 | A1* | 1/2014 | Kim | G11C 7/1057 365/158 |
| 2014/0379976 | A1* | 12/2014 | Wu | G11C 7/22 711/105 |

OTHER PUBLICATIONS

"Office Action of Taiwan Counterpart Application", dated Jan. 11, 2021, p. 1-p. 10.

\* cited by examiner

MEMORY INTERFACE CIRCUIT, MEMORY STORAGE DEVICE AND SIGNAL GENERATION METHOD

CROSS-REFERENCE TO RELATED APPLICATION

This application claims the priority benefit of Taiwan application serial no. 108126253, filed on Jul. 24, 2019. The entirety of the above-mentioned patent application is hereby incorporated by reference herein and made a part of this specification.

BACKGROUND

Technical Field

The invention relates to a memory interface technology, and more particularly, relates to a memory interface circuit, a memory storage device and a signal generation method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Most memory storage devices are disposed with a volatile memory module (e.g., a dynamic random access memory (DRAM)) to temporarily store data and/or improve a data access performance. A memory controller in the memory storage device can send a command signal and an address signal to the volatile memory module to instruct the volatile memory module to access data stored at one specific memory address. For example, the command signal and the address signal can be transmitted to the volatile memory module via different pins.

In general, both the command signal and the address signal are transmitted according to the same reference clock. For example, the command signal and the address signal can be synchronously transitioned in response to the same rising edge (or falling edge) of a reference clock signal and transitioned again at the next rising edge (or falling edge) to complete a bit transmission. In other words, the command signal and the address signal often have the same transmission cycle. However, because such a transmission mechanism will have a relatively strong interference between the signals, a signal receiver and/or a signal transmitter need to have a strong anti-noise capability in order to accurately transmit data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a memory interface circuit, a memory storage device and a signal generation method, which can effectively improve a signal transmission efficiency.

An exemplary embodiment of the invention provides a memory interface circuit, which is configured to connect a volatile memory module and a memory controller. The memory interface circuit includes a clock generation circuit, a first interface circuit and a second interface circuit. The clock generation circuit is configured to provide a reference clock signal. The first interface circuit is coupled to the memory controller and the clock generation circuit and configured to provide an address signal to the volatile memory module based on a first transition point of the reference clock signal. The second interface circuit is coupled to the memory controller and the clock generation circuit and configured to provide a command signal to the volatile memory module based on a second transition point of the reference clock signal. The first transition point is one of a rising edge and a falling edge of the reference clock signal. The second transition point is the other one of the rising edge and the falling edge of the reference clock signal.

An exemplary embodiment of the invention further provides a memory storage device, which includes a volatile memory module and a memory control circuit unit. The memory control circuit unit is coupled to the volatile memory module. The memory control circuit unit is configured to provide a reference clock signal. The memory control circuit unit is further configured to provide an address signal to the volatile memory module based on a first transition point of the reference clock signal. The memory control circuit unit is further configured to provide a command signal to the volatile memory module based on a second transition point of the reference clock signal. The first transition point is one of a rising edge and a falling edge of the reference clock signal. The second transition point is the other one of the rising edge and the falling edge of the reference clock signal.

An exemplary embodiment of the invention further provides a signal generation method for a memory control circuit unit to communicate with a volatile memory module. The signal generation method includes: providing a reference clock signal; providing an address signal to the volatile memory module based on a first transition point of the reference clock signal; and providing a command signal to the volatile memory module based on a second transition point of the reference clock signal, The first transition point is one of a rising edge and a falling edge of the reference clock signal. The second transition point is the other one of the rising edge and the falling edge of the reference clock signal.

An exemplary embodiment of the invention further provides a memory interface circuit, which is configured to connect a volatile memory module and a memory controller. The memory interface circuit includes a first interface circuit and a second interface circuit. The first interface circuit is coupled to the memory controller and configured to provide an address signal to the volatile memory module. The second interface circuit is coupled to the memory controller and configured to provide a command signal to the volatile memory module. A transmission cycle of the address signal is greater than a transmission cycle of the command signal.

An exemplary embodiment of the invention further provides a memory storage device, which includes a volatile memory module and a memory control circuit unit. The memory control circuit unit is coupled to the volatile memory module. The memory control circuit unit is configured to provide an address signal and a command signal to the volatile memory module, and a transmission cycle of the address signal is greater than a transmission cycle of the command signal.

An exemplary embodiment of the invention further provides a signal generation method for a memory control circuit unit to communicate with a volatile memory module. The signal generation method includes: providing an address signal and a command signal to the volatile memory module, wherein a transmission cycle of the address signal is greater than a transmission cycle of the command signal.

Based on the above, in certain exemplary embodiments, the command signal and the address signal can be respectively provided to the volatile memory module based on the rising edge and the falling edge (or the falling edge and the rising edge) of the reference clock signal, and/or in certain exemplary embodiments, the command signal and the address signal provided to the volatile memory module can have the different transmission cycles. As a result, the signal transmission efficiency between the memory interface circuit and the volatile memory module can be effectively improved.

To make the aforementioned more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Exemplary embodiments are provided below to describe the invention in detail, though the invention is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

It is noted that in the following description, some terms may be replaced with corresponding abbreviations for ease of reading (see Table 1).

TABLE 1

| rewritable non-volatile memory module | RNVM module |
|---|---|
| volatile memory module | VM module |
| memory storage device | MSD |
| memory control circuit unit | MCCU |

Figure 1:
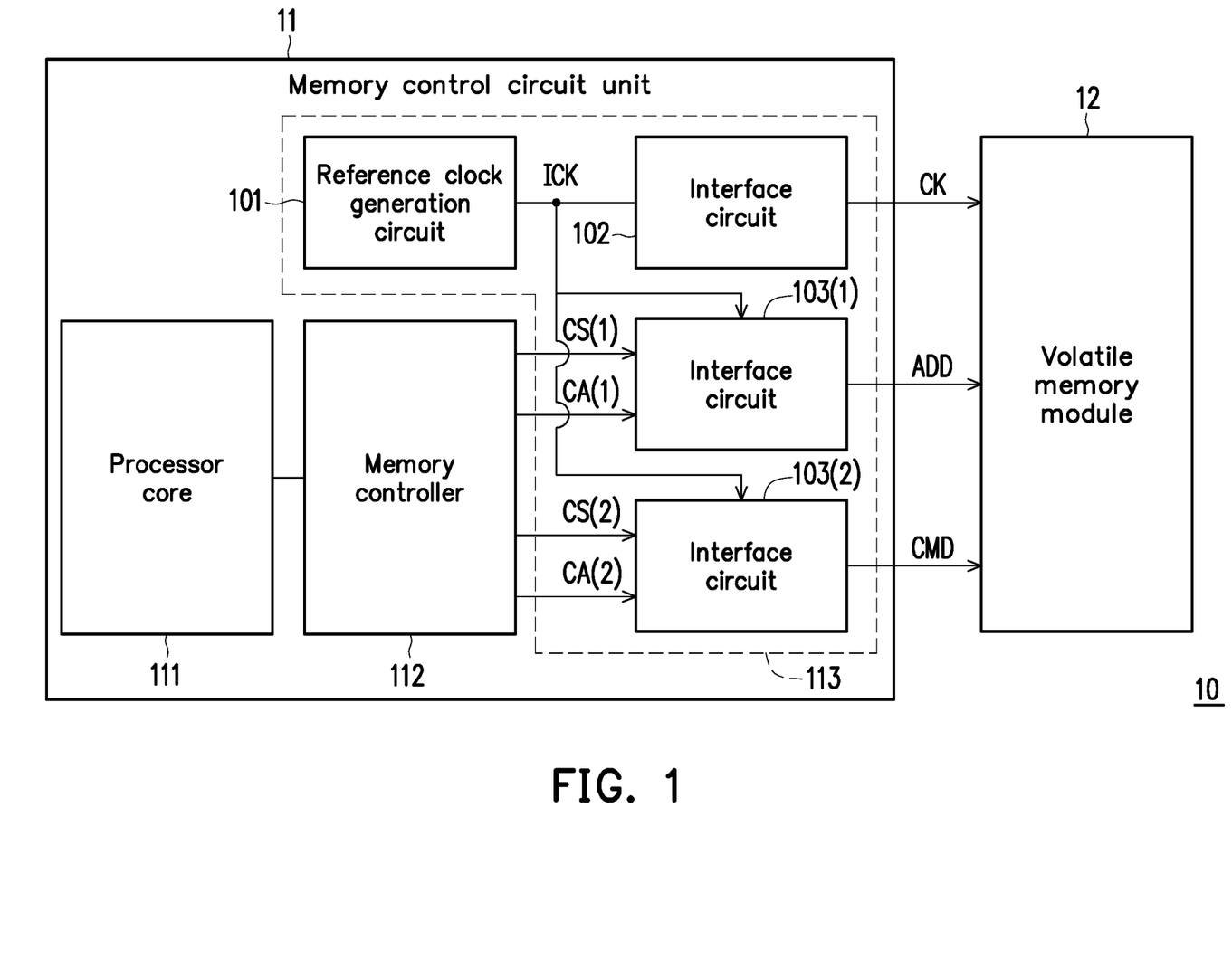
FIG. 1 is a schematic diagram illustrating a memory storage device according to an exemplary embodiment of the invention.

FIG. 1 is a schematic diagram illustrating a MSD according to an exemplary embodiment of the invention. With reference to FIG. 1, a MSD 10 includes a MCCU 11 and a VM module 12. The MCCU 11 and the VM module 12 may be installed on one or more circuit boards in the MSD 10. The MCCU 11 supports separate and/or parallel data access operations for the VM module 12.

In an exemplary embodiment, the MCCU 11 is regarded as a control chip of the VM module 12, and the VM module 12 may be regarded as a cache memory or a buffer memory of the MCCU 11. For example, the VM module 12 may include various types of VM modules including a DDR SDRAM (first generation Double Data Rate Synchronous Dynamic Random Access Memory), a DDR 2 SDRAM (second generation Double Data Rate Synchronous Dynamic Random Access Memory), a DDR 3 SDRAM (third generation Double Data Rate Synchronous Dynamic Random Access Memory), a DDR 4 SDRAM (fourth generation Double Data Rate Synchronous Dynamic Random Access Memory).

The MCCU 11 includes a processor core 111, a memory controller 112 and a memory interface circuit 113. The memory controller 112 is coupled to the processor core 111 and the memory interface circuit 113. The processor core 111 is configured to control an overall operation of the MCCU 11 or the MSD 10. For example, the processor core

111 may include a processing chip, such as a CPU (Central Processing Unit) or a microprocessor of single-core or multi-core.

The memory controller 112 serves as a communication bridge between the processor core 111 and the VM module 12 and is dedicated to control the VM module 12. In this exemplary embodiment, the memory controller 112 is also known as a dynamic random access memory controller (DRAM controller).

The memory interface circuit 113 is configured to connect the memory interface circuit 112 (or the MCCU 11) to the VM module 12. When the processor core 111 intends to read data from the VM module 12 or store data into the VM module 12, the memory controller 112 can send a control command to the VM module 12 through the memory interface circuit 113. When the control command is received by the VM module 12, the VM module 12 can store write-data corresponding to the control command or return read-data corresponding to the control command to the memory controller 112 through the memory interface circuit 113.

The memory controller 112 can send a signal (a.k.a. an address signal) ADD and a signal (a.k.a. a command signal) CMD to the VM module 12 through the memory interface circuit 113. The command signal CMD is configured to instruct the VM module 12 to perform a data reading, a data writing or a data deleting. The address signal ADD is configured to indicate a memory address. According to the command signal CMD and the address signal ADD, the VM module 12 can perform an operation instructed by the command signal CMD (e.g., the data reading, the data writing or the data deleting) on the memory address indicated by the address signal ADD.

The memory interface circuit 113 includes a reference clock generation circuit 101, an interface circuit 102, an interface circuit (a.k.a. a first interface circuit) 103(1), and an interface circuit (a.k.a. a second interface circuit) 103(2). The reference clock generation circuit 101 is coupled to the interface circuits 102, 103(1) and 103(2). The reference clock generation circuit 101 is configured to generate a signal (a.k.a. a reference clock signal) ICK. For example, the reference clock generation circuit 101 may include a quartz oscillator, a ceramic oscillator or a resistance-capacitance oscillator. The type of the oscillator adopted by the reference clock generation circuit 101 is not particularly limited in the invention. The reference clock generation circuit 101 can provide the reference clock signal ICK to the interface circuits 102, 103(1) and 103(2). The interface circuit 102 can receive the reference clock signal ICK and provide a signal (a.k.a. a clock signal) CK to the VM module 12. For example, a frequency of the reference clock signal ICK can be the same as a frequency of the clock signal CK. Accordingly, the VM module 12 can analyze the command signal CMD and the address signal ADD according to the clock signal CK.

The interface circuit 103(1) is coupled to the memory controller 112 and the reference clock generation circuit 101. The interface circuit 103(1) can receive the reference clock signal ICK and provide the address signal ADD to the VM module 12 based on one specific transition point (a.k.a. a first transition point) of the reference clock signal ICK. For example, the first transition point may be one of a rising edge and a falling edge of the reference clock signal ICK. The interface circuit 103(2) is also coupled to the memory controller 112 and the reference clock generation circuit 101. The interface circuit 103(2) can receive the reference clock signal ICK and provide the command signal CMD to the VM module 12 based on another transition point (a.k.a. a second transition point) of the reference clock signal ICK. For example, the second transition point may be the other one of the rising edge and the falling edge of the reference clock signal ICK.

In other words, if the first transition point is the rising edge of the reference clock signal ICK, the second transition point is the falling edge of the reference clock signal ICK. Alternatively, if the first transition point is the falling edge of the reference clock signal ICK, the second transition point is the rising edge of the reference clock signal ICK.

It should be noted that the interface circuits 103(1) and 103(2) of FIG. 1 are merely examples. In another exemplary embodiment, both the number of interface circuits 103(1) and the number of interface circuits 103(2) may be more. For example, in an exemplary embodiment, the number of interface circuits 103(1) may be 17, and the number of interface circuits 103(2) may be 5. Accordingly, the memory interface circuit 113 can synchronously transmit the address signal ADD via 17 pins and synchronously transmit the command signal CMD via 5 pins.

Figure 2:
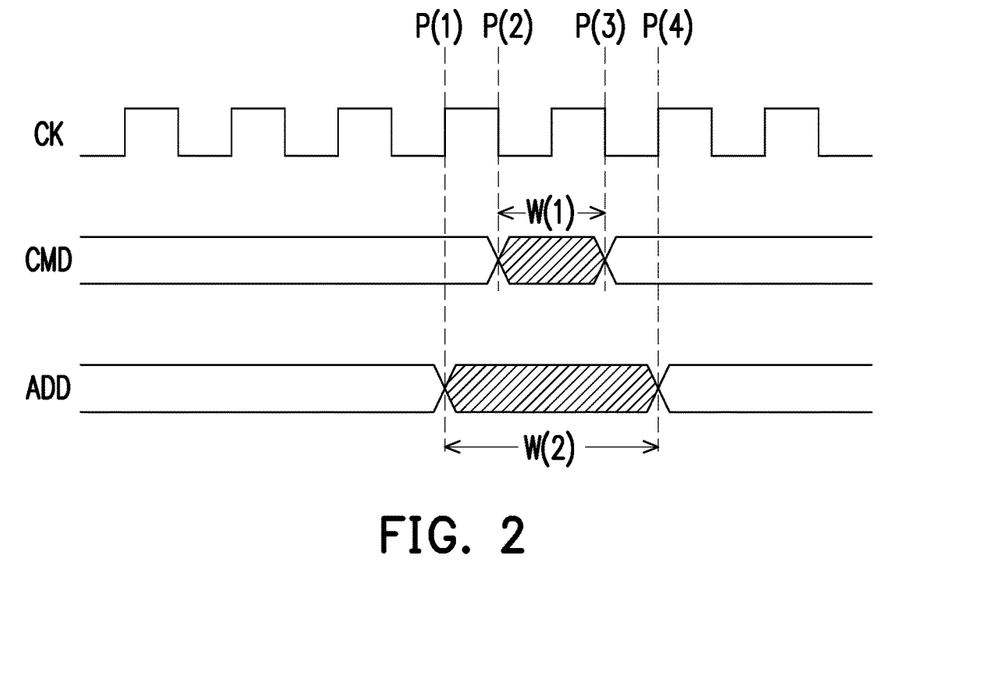
FIG. 2 is a schematic diagram illustrating a clock signal, an address signal and a command signal according to an exemplary embodiment of the invention.

FIG. 2 is a schematic diagram illustrating a clock signal, an address signal and a command signal according to an exemplary embodiment of the invention. With reference to FIG. 2, at a transition point P(1), in response to a rising edge of the clock signal CK, the address signal ADD is transitioned (e.g., pulled up) to transfer address information. Then, at a transition point P(2), in response to a falling edge of the clock signal CK, the command signal CMD is transitioned (e.g., pulled up) to transfer command data. Then, at a transition point P(3), in response to the falling edge of the clock signal CK, the command signal CMD is transitioned again (e.g., pulled down) to end a transmission of the command data. Then, at a transition point P(4), in response to the rising edge of the clock signal CK, the address signal ADD is transitioned again (e.g., pulled down) to end a transmission of the address information.

In an exemplary embodiment, a waveform of the command signal CMD between the transition points P(2) and P(3) can be regarded as an eye pattern of the command signal CMD (marked by slashes). The VM module 12 of FIG. 1 can sample the command signal CMD between the transition points P(2) and P(3) to obtain the corresponding command data. In addition, a width of the eye pattern of the command signal CMD can be regarded as a transmission cycle W(1) of the command signal CMD.

In an exemplary embodiment, a waveform of the address signal ADD between the transition points P(1) and P(4) can be regarded as an eye pattern of the address signal ADD (marked by slashes). The VM module 12 of FIG. 1 can sample the address signal ADD between the transition points P(1) and P(4) to obtain the corresponding address information. In addition, a width of the eye pattern of the address signal ADD can be regarded as a transmission cycle W(2) of the address signal ADD.

In an exemplary embodiment, the transmission cycle W(2) of the address signal ADD is greater than the transmission cycle W(1) of the command signal CMD. In an exemplary embodiment, the transmission cycle W(2) of the address signal ADD can be twice the transmission cycle W(1) of the command signal CMD. Taking FIG. 2 as an example, the transmission cycle W(1) can correspond to one clock cycle of the clock signal CK, and the transmission cycle W(2) can correspond to two clock cycles of the clock signal CK. It should be noted that, because the transmission cycle of the signal will also be affected by noise in practice, the transmission cycles W(1) and W(2) may be wider or narrower. The invention is not limited in this regard. For example, in another exemplary embodiment, the transmission cycle W(2) may be three times or four times the transmission cycle W(1).

It should be noted that, in an exemplary embodiment, the fact that the transmission cycle W(2) of the address signal ADD is greater than the transmission cycle W(1) of the command signal CMD is deliberately controlled by the interface circuits 103(1) and 103(2) rather than a difference in transmission cycle generated based on noise. Therefore, the VM module 12 of FIG. 1 will have a higher tolerance for analyzing the address signal ADD to obtain the corresponding address information. After sampling the command signal CMD to obtain the corresponding command data, the VM module 12 can then perform a data access with respect to the memory address indicated by the address signal ADD.

Returning to FIG. 1, in an exemplary embodiment, the interface circuit 103(1) can receive a signal (a.k.a. a first indication signal) CA(1) from the memory controller 112, and the interface circuit 103(2) can receive a signal (a.k.a. a second indication signal) CA(2) from the memory controller 112. The first indication signal CA(1) can carry the address information. The interface circuit 103(1) can sample the first indication signal CA(1) based on the first transition point to generate the address signal ADD. The second indication signal CA(2) can carry the command data. The interface circuit 103(2) can sample the second indication signal CA(2) based on the second transition point to generate the command signal CMD.

Accordingly, the address signal ADD and the command signal CMD being generated can have the same or similar signal waveforms as shown in FIG. 2.

In an exemplary embodiment, the interface circuit 103(1) can sample the first indication signal CA(1) based on one specific reference clock signal (a.k.a. a first reference clock signal) to generate the address signal ADD. The interface circuit 103(2) can sample the second indication signal CA(2) based on another specific reference clock signal (a.k.a. a second reference clock signal) to generate the command signal CMD. The first reference clock signal is inverted from the second reference clock signal. That is, a phase of the first reference clock signal is different from a phase of the second reference clock signal by 90 degrees. The first reference clock signal and the second reference clock signal may both be obtained according to the reference clock signal ICK. For example, if the phase of the first reference clock signal is the same as the phase of the reference clock signal ICK, the phase of the second reference clock signal is inverted from the phase of the reference clock signal ICK. Alternatively, if the phase of the second reference clock signal is the same as the phase of the reference clock signal ICK, the phase of the first reference clock signal is inverted from the phase of the reference clock signal ICK. In this way, the interface circuits 103(1) and 103(2) can generate the address signal ADD and the command signal CMD, respectively.

Figure 3:
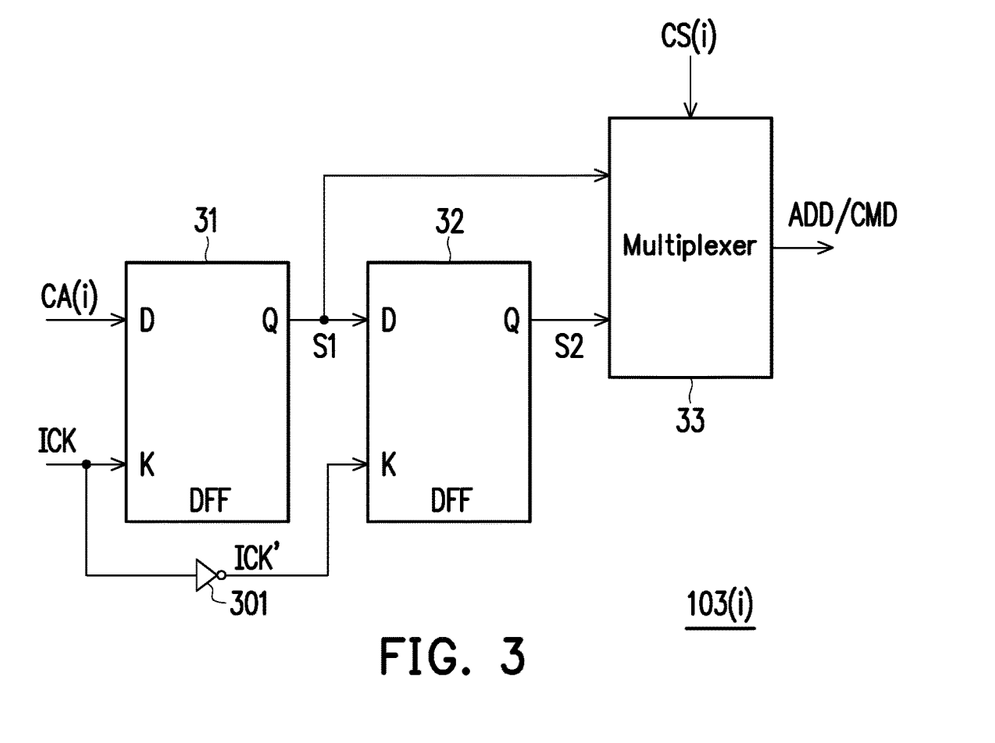
FIG. 3 is a schematic diagram illustrating an interface circuit according to an exemplary embodiment of the invention.

FIG. 3 is a schematic diagram illustrating an interface circuit according to an exemplary embodiment of the invention. Referring to FIG. 1 and FIG. 3, a label i may be 1 or 2. If i is 1, an interface circuit 103(i) can represent the interface circuit 103(1). Alternatively, if i is 2, the interface circuit 103(i) can represent the interface circuit 103(2).

The interface circuit 103(i) can include a sampling circuit (a.k.a. a first sampling circuit) 31, a sampling circuit (a.k.a. a second sampling circuit) 32 and a multiplexer 33. In this exemplary embodiment, the sampling circuits 31 and 32 are both exemplified by a flip-flop. However, in another exemplary embodiment, the sampling circuits 31 and 32 may also include other types of sampling circuits, which are not limited in the invention.

The sampling circuit 31 can receive an indication signal CA(i) and the reference clock signal ICK. The indication signal CA(i) may be the indication signals CA(1) or CA(2) of FIG. 1. The sampling circuit 31 can sample the indication signal CA(i) according to the reference clock signal ICK (e.g., the rising edge of the reference clock signal ICK) and generate an output signal (a.k.a. a first output signal) S1. The output signal S1 can be provided to one input terminal of the multiplexer 33.

The interface circuit 103(i) may further include an inverting element 301. The inverting element 301 can receive the reference clock signal ICK and generate an inverted signal ICK' of the reference clock signal ICK. For example, a phase of the inverted signal ICK' is different from a phase of the reference clock signal ICK by 90 degrees. The sampling circuit 32 can receive the output signal S1 and the inverted signal ICK'. The sampling circuit 32 can sample the indication signal CA(i) (or the output signal S1) according to the inverted signal ICK' (e.g., a rising edge of the inverted signal ICK') and generate an output signal (a.k.a. a second output signal) S2. The output signal S2 can be provided to another input terminal of the multiplexer 33.

The multiplexer 33 can receive a control signal CS(i) from the memory controller 112. The control signal CS(i) may be control signals CS(1) or CS(2) of FIG. 1. The multiplexer 33 can selectively output the output signals S1 or S2 as the address signal ADD or the command signal CMD according to the control signal CS(i). For example, if the indication signal CA(i) carries the address information, the signal S1 or S2 can be output as the address signal ADD. Alternatively, if the indication signal CA(i) carries the command data, the signal S1 or S2 can be output as the command signal CMD.

Figure 4:
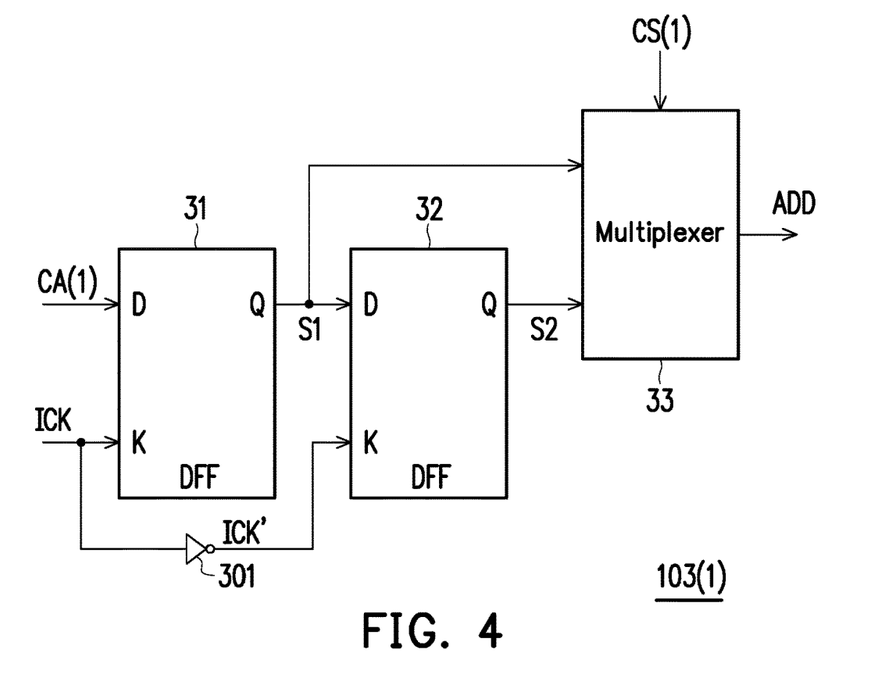
FIG. 4 is a schematic diagram illustrating the interface circuit generating the address signal according to an exemplary embodiment of the invention.

FIG. 4 is a schematic diagram illustrating the interface circuit generating the address signal according to an exemplary embodiment of the invention. With reference to FIG. 4, it is assumed that the indication signal CA(1) carries the address information. The sampling circuit 31 can sample the indication signal CA(1) according to the reference clock signal ICK (e.g., the rising edge of the reference clock signal ICK) and generate the output signal S1. The multiplexer 33 can receive the output signal S(1) and output the output signal S(1) as the address signal ADD according to the control signal CS(1).

Figure 5:
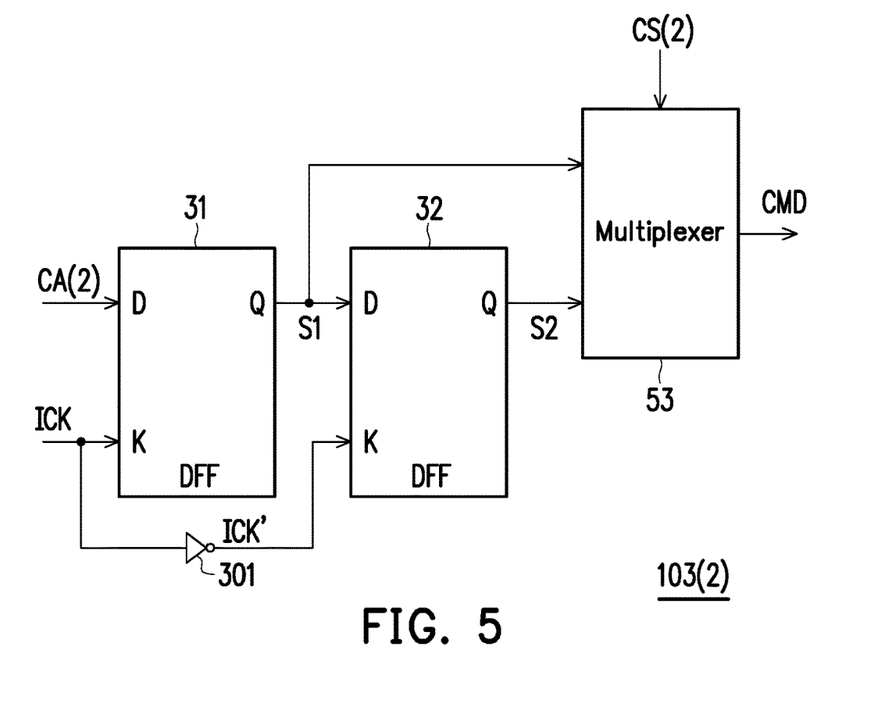
FIG. 5 is a schematic diagram illustrating the interface circuit generating the command signal according to an exemplary embodiment of the invention.

FIG. 5 is a schematic diagram illustrating the interface circuit generating the command signal according to an exemplary embodiment of the invention. With reference to FIG. 5, it is assumed that the indication signal CA(2) carries the command data. The sampling circuit 32 can sample the indication signal CA(2) (or the output signal S1) according to the inverted signal ICK' (e.g., the rising edge of the inverted signal ICK') and generate the output signal S2. The multiplexer 33 can receive the output signal S(2) and output the output signal S(2) as the command signal CMD according to the control signal CS(2).

In other words, in the exemplary embodiment of FIG. 4, the address signal ADD may be output based on the first transition point of the reference clock signal ICK (e.g., the rising edge of the reference clock signal ICK). In the exemplary embodiment of FIG. 5, the command signal CMD may be output based on the second transition point of the reference clock signal ICK (e.g., the falling edge of the reference clock signal ICK). The VM module 12 can perform a data access operation according to the command signal CMD and the address signal ADD synchronously received. In addition, in certain exemplary embodiments of FIG. 4 and FIG. 5, the reference clock signal ICK can also be regarded as the first reference clock signal, and the inverted signal ICK' can also be regarded as the second reference clock signal.

It should be noted that in another exemplary embodiment of FIG. 4 and FIG. 5, the control signal CS(1) can also instruct the multiplexer 33 to output the output signal S2 as the address signal ADD, and/or the control signal CS(2) can also instruct the multiplexer 33 to output the output signal S1 as the command signal CMD. The invention is not limited in this regard.

Figure 6:
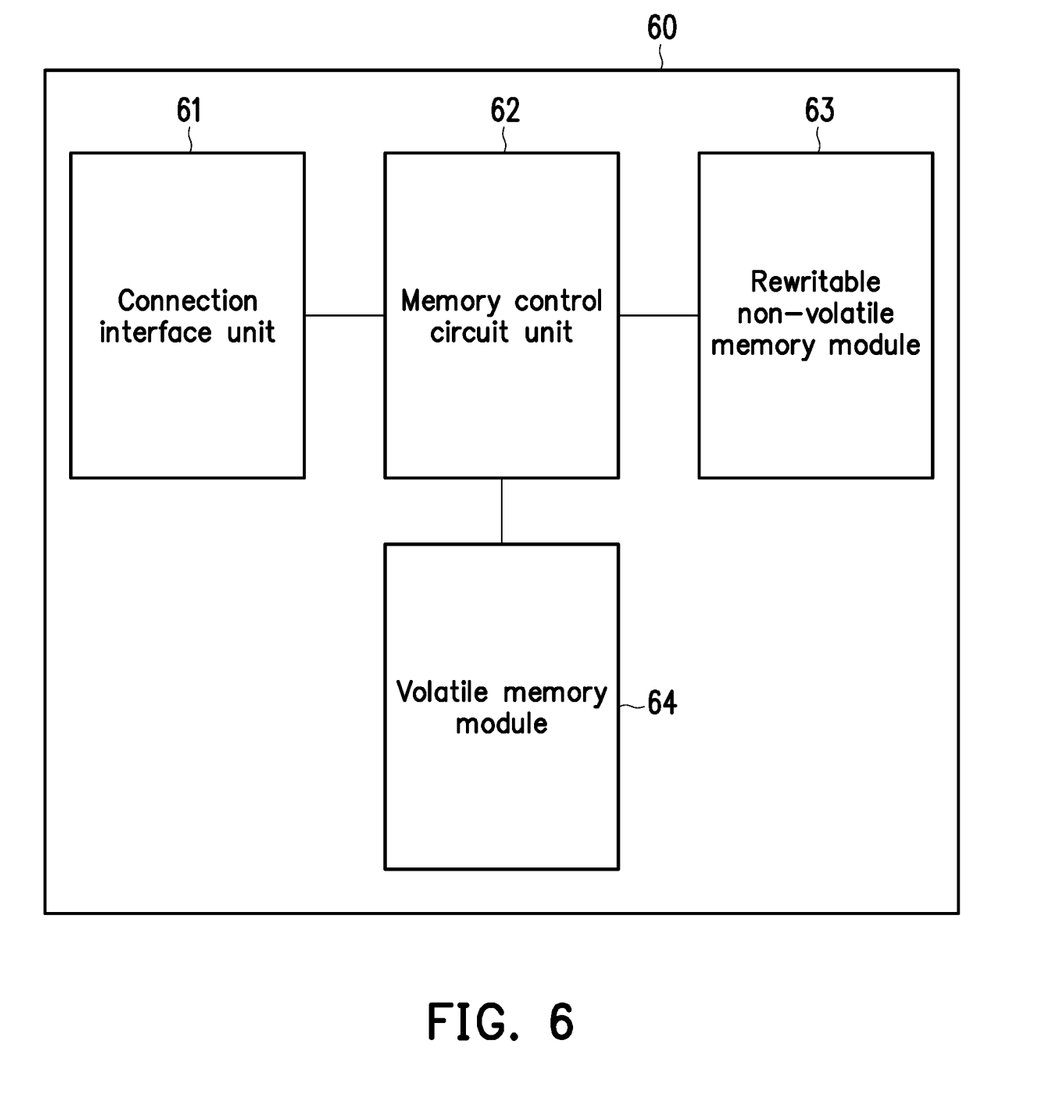
FIG. 6 is a schematic diagram illustrating a memory storage device according to an exemplary embodiment of the invention.

FIG. 6 is a schematic diagram illustrating a MSD according to an exemplary embodiment of the invention. With reference to FIG. 6, a MSD 60 is a MSD including both a RNVM module 63 and a VM module 64, such as a SSD (Solid State Drive). The MSD 60 can be used together with a host system so the host system can write data into the MSD 60 or read data from the MSD 60. For example, the mentioned host system may be any system capable of substantially cooperating with the MSD 60 for storing data, such as a desktop computer, a notebook computer, a digital camera, a video camera, a communication device, an audio player, a video player or a tablet computer.

The MSD 60 includes a connection interface unit 61, a MCCU 62, the RNVM module 63 and the VM module 64. The connection interface unit 61 is configured to connect the MSD 60 to the host system. In an exemplary embodiment, the connection interface unit 61 is compatible with a SATA (Serial Advanced Technology Attachment) standard. Nevertheless, it should be understood that the invention is not limited in this regard. The connection interface unit 61 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 61 can be packaged into one chip with the MCCU 62, or the connection interface unit 61 can also be distributed outside of a chip containing the MCCU 62.

The MCCU 62 is configured to perform operations of writing, reading or erasing data in the RNVM module 63 according to the control commands. The MCCU 62 can include the MCCU 11 in FIG. 1 to control the VM module 64.

The RNVM module 63 is coupled to the MCCU 62 and configured to store data written from the host system. The RNVM module 63 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Qual Level Cell) NAND-type flash memory module (i.e., a flash memory module capable of storing four bits in one memory cell), other flash memory modules or other memory modules having the same features.

In an exemplary embodiment, the MCCU 62 also includes identical or similar functions and/or electronic circuit structures of the MCCU 11 mentioned in the exemplary embodiment of FIG. 1, and the volatile memory 64 is identical or similar to the VM module 12 mentioned in the exemplary embodiment of FIG. 1. Therefore, description regarding the MCCU 62 and the VM module 64 can refer to the exemplary embodiments of FIG. 1 and FIG. 2, which are not repeated hereinafter.

It should be noted that, the electronic circuit structures illustrated in FIG. 3 to FIG. 5 are merely schematic drawings of the memory interface circuit 113 in certain exemplary embodiments instead of limitations to the invention. In certain non-mentioned applications, more electronic components can be added to the memory interface circuit 113 or used to replace some existing electronic components to provide additional, identical or similar functionality. Moreover, in certain non-mentioned applications, a circuit layout and/or a coupling relation between elements inside the memory interface circuit 113 may also be properly altered to meet practical requirements.

Figure 7:
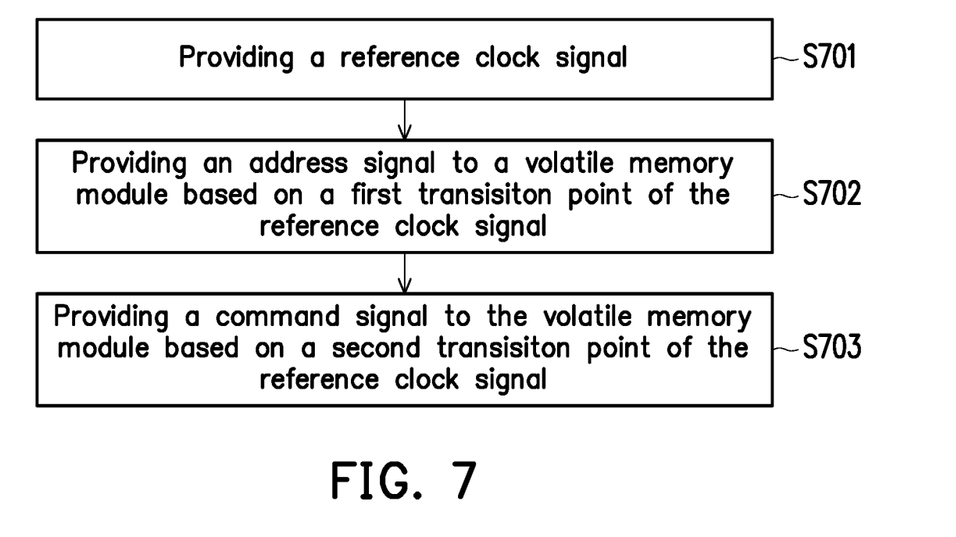
FIG. 7 is a flowchart illustrating a signal generation method according to an exemplary embodiment of the invention.

FIG. 7 is a flowchart illustrating a signal generation method according to an exemplary embodiment of the invention. With reference to FIG. 7, in step S701, a reference clock signal is provided. In step S702, an address signal is provided to a VM module based on a first transition point of the reference clock signal. In step S703, a command signal is provided to the VM module based on a second transition point of the reference clock signal. The first transition point is one of a rising edge and a falling edge of the reference clock signal. The second transition point is the other one of the rising edge and the falling edge of the reference clock signal.

Figure 8:
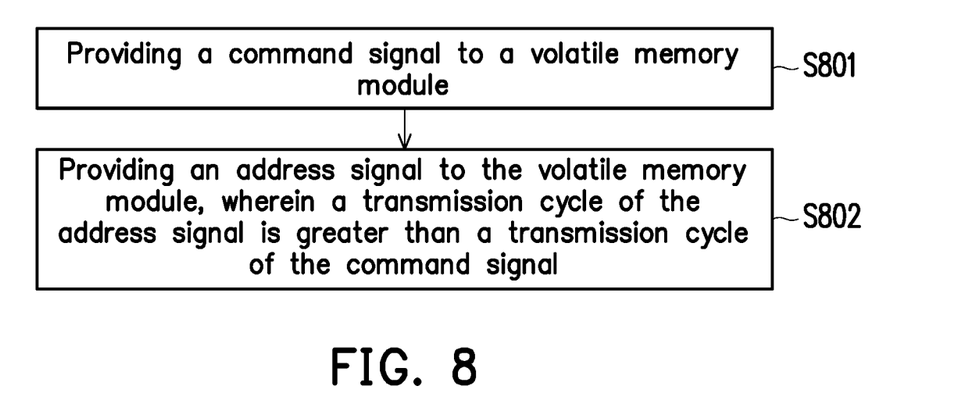
FIG. 8 is a flowchart illustrating a signal generation method according to an exemplary embodiment of the invention.

FIG. 8 is a flowchart illustrating a signal generation method according to an exemplary embodiment of the invention. With reference to FIG. 8, in step S801, a command signal is provided to a VM module. In step S802, an address signal is provided to the VM module, wherein a transmission cycle of the address signal is greater than a transmission cycle of the command signal.

Nevertheless, each of steps depicted in FIG. 7 and FIG. 8 have been described in detail as above, thus related description thereof is not repeated hereinafter. It should be noted that, the steps depicted in FIG. 7 and FIG. 8 may be implemented as a plurality of program codes or circuits, which are not particularly limited in the invention. Moreover, the methods disclosed in FIG. 7 and FIG. 8 may be implemented with reference to above embodiments, or may be implemented separately, which are not particularly limited in the invention.

In summary, in certain exemplary embodiments, the command signal and the address signal can be provided to the VM module based on the rising edge and the falling edge (or the falling edge and the rising edge) of the reference clock signal. In addition, in certain exemplary embodiments, the command signal and the address signal provided to the VM module can have the different transmission cycles (a.k.a. data transmission cycles). For example, the data transmission cycle of the address signal is greater than the data transmission cycle of the command signal. Therefore, in an exemplary embodiment, the address signal and the command signal can be accurately analyzed even if an additional on-die termination (ODT) resistor is not provided in the memory interface circuit or the VM module. As a result, the signal transmission efficiency between the memory interface circuit and the VM module can be effectively improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory interface circuit, configured to connect a volatile memory module and a memory controller, and the memory interface circuit comprises:
   a clock generation circuit, configured to provide a reference clock signal;
   a first interface circuit, coupled to the memory controller and the clock generation circuit and configured to provide an address signal to the volatile memory module based on a first transition point of the reference clock signal; and
   a second interface circuit, coupled to the memory controller and the clock generation circuit and configured to provide a command signal to the volatile memory module based on a second transition point of the reference clock signal,
   wherein the first transition point is one of a rising edge and a falling edge of the reference clock signal, and the second transition point is the other one of the rising edge and the falling edge of the reference clock signal,
   wherein at least one of the first interface circuit and the second interface circuit comprises:
   a first sampling circuit, configured to sample an indication signal from the memory controller according to the reference clock signal and generate a first output signal; and
   a multiplexer, coupled to the first sampling circuit and configured to output the first output signal according to a control signal.

2. The memory interface circuit according to claim 1, wherein a transmission cycle of the address signal is greater than a transmission cycle of the command signal.

3. The memory interface circuit according to claim 1, wherein an operation of providing the address signal to the volatile memory module based on the first transition point of the reference clock signal by the first interface circuit comprises:
   sampling a first indication signal from the memory controller based on the first transition point to generate the address signal, and
   an operation of providing the command signal to the volatile memory module based on the second transition point of the reference clock signal by the second interface circuit comprises:
   sampling a second indication signal from the memory controller based on the second transition point to generate the command signal.

4. The memory interface circuit according to claim 1, wherein an operation of providing the address signal to the volatile memory module based on the first transition point of the reference clock signal by the first interface circuit comprises:
   sampling a first indication signal from the memory controller based on a first reference clock signal to generate the address signal, and
   an operation of providing the command signal to the volatile memory module based on the second transition point of the reference clock signal by the second interface circuit comprises:
   sampling a second indication signal from the memory controller based on a second reference clock signal to generate the command signal,
   wherein the first reference clock signal is inverted from the second reference clock signal.

5. The memory interface circuit according to claim 1, wherein the at least one of the first interface circuit and the second interface circuit further comprises:
   a second sampling circuit, coupled to the first sampling circuit and the multiplexer and configured to sample the indication signal from the memory controller according to an inverted signal of the reference clock signal and generate a second output signal, wherein
   the multiplexer is further configured to output the second output signal according to the control signal.

6. A memory storage device, comprising:
   a volatile memory module; and
   a memory control circuit unit, coupled to the volatile memory module;
   wherein the memory control circuit unit is configured to provide a reference clock signal,
   the memory control circuit unit is further configured to provide an address signal to the volatile memory module based on a first transition point of the reference clock signal,
   the memory control circuit unit is further configured to provide a command signal to the volatile memory module based on a second transition point of the reference clock signal,
   the first transition point is one of a rising edge and a falling edge of the reference clock signal, and the second transition point is the other one of the rising edge and the falling edge of the reference clock signal,
   wherein the memory control circuit unit comprises:
   a first sampling circuit, configured to sample an indication signal from a memory controller according to the reference clock signal and generate a first output signal; and
   a multiplexer, coupled to the first sampling circuit and configured to output the first output signal according to a control signal.

7. The memory storage device according to claim 6, wherein a transmission cycle of the address signal is greater than a transmission cycle of the command signal.

8. The memory storage device according to claim 6, wherein an operation of providing the address signal to the volatile memory module based on the first transition point of the reference clock signal by the memory control circuit unit comprises:
   sampling a first indication signal from a memory controller based on the first transition point to generate the address signal, and
   an operation of providing the command signal to the volatile memory module based on the second transition point of the reference clock signal by the memory control circuit unit comprises:
   sampling a second indication signal from the memory controller based on the second transition point to generate the command signal.

9. The memory storage device according to claim 6, wherein an operation of providing the address signal to the volatile memory module based on the first transition point of the reference clock signal by the memory control circuit unit comprises:
   sampling a first indication signal from a memory controller based on a first reference clock signal to generate the address signal, and
   an operation of providing the command signal to the volatile memory module based on the second transition point of the reference clock signal by the memory control circuit unit comprises:
   sampling a second indication signal from the memory controller based on a second reference clock signal to generate the command signal, wherein the first reference clock signal is inverted from the second reference clock signal.

10. The memory storage device according to claim 6, wherein the memory control circuit unit further comprises:
a second sampling circuit, coupled to the first sampling circuit and the multiplexer and configured to sample the indication signal from the memory controller according to an inverted signal of the reference clock signal and generate a second output signal, wherein
the multiplexer is further configured to output the second output signal according to the control signal.

11. A signal generation method for a memory control circuit unit to communicate with a volatile memory module, and the signal generation method comprises:
providing a reference clock signal;
providing an address signal to the volatile memory module based on a first transition point of the reference clock signal;
providing a command signal to the volatile memory module based on a second transition point of the reference clock signal;
sampling an indication signal from a memory controller according to the reference clock signal and generate a first output signal; and
outputting the first output signal according to a control signal,
wherein the first transition point is one of a rising edge and a falling edge of the reference clock signal, and the second transition point is the other one of the rising edge and the falling edge of the reference clock signal.

12. The signal generation method according to claim 11, wherein a transmission cycle of the address signal is greater than a transmission cycle of the command signal.

13. The signal generation method according to claim 11, wherein a step of providing the address signal to the volatile memory module based on the first transition point of the reference clock signal comprises:
sampling a first indication signal from a memory controller based on the first transition point to generate the address signal, and
a step of providing the command signal to the volatile memory module based on the second transition point of the reference clock signal comprises:
sampling a second indication signal from the memory controller based on the second transition point to generate the command signal.

14. The signal generation method according to claim 11, wherein a step of providing the address signal to the volatile memory module based on the first transition point of the reference clock signal comprises:
sampling a first indication signal from a memory controller based on a first reference clock signal to generate the address signal, and
a step of providing the command signal to the volatile memory module based on the second transition point of the reference clock signal comprises:
sampling a second indication signal from the memory controller based on a second reference clock signal to generate the command signal,
wherein the first reference clock signal is inverted from the second reference clock signal.

15. A memory interface circuit, configured to connect a volatile memory module and a memory controller, and the memory interface circuit comprises:
a first interface circuit, coupled to the memory controller and configured to provide an address signal to the volatile memory module; and
a second interface circuit, coupled to the memory controller and configured to provide a command signal to the volatile memory module,
wherein a transmission cycle of the address signal is greater than a transmission cycle of the command signal,
wherein at least one of the first interface circuit and the second interface circuit comprises:
a first sampling circuit, configured to sample an indication signal from the memory controller according to a reference clock signal and generate a first output signal; and
a multiplexer, coupled to the first sampling circuit and configured to output the first output signal according to a control signal.

16. The memory interface circuit according to claim 15, wherein the first interface circuit is further configured for:
sampling a first indication signal from the memory controller based on a first transition point of a reference clock signal to generate the address signal, and
the second interface circuit is further configured for:
sampling a second indication signal from the memory controller based on a second transition point of the reference clock signal to generate the command signal,
wherein the first transition point is one of a rising edge and a falling edge of the reference clock signal, and the second transition point is the other one of the rising edge and the falling edge of the reference clock signal.

17. The memory interface circuit according to claim 15, wherein the first interface circuit is further configured for:
sampling a first indication signal from the memory controller based on a first reference clock signal to generate the address signal, and
the second interface circuit is further configured for:
sampling a second indication signal from the memory controller based on a second reference clock signal to generate the command signal,
wherein the first reference clock signal is inverted from the second reference clock signal.

18. The memory interface circuit according to claim 15, wherein the at least one of the first interface circuit and the second interface circuit further comprises:
a second sampling circuit, coupled to the first sampling circuit and the multiplexer and configured to sample the indication signal from the memory controller according to an inverted signal of the reference clock signal and generate a second output signal, wherein
the multiplexer is further configured to output the second output signal according to the control signal.

19. A memory storage device, comprising:
a volatile memory module; and
a memory control circuit unit, coupled to the volatile memory module,
wherein the memory control circuit unit is configured to provide an address signal and a command signal to the volatile memory module, and
a transmission cycle of the address signal is greater than a transmission cycle of the command signal,
wherein the memory control circuit unit comprises:
a first sampling circuit, configured to sample an indication signal from a memory controller according to a reference clock signal and generate a first output signal; and
a multiplexer, coupled to the first sampling circuit and configured to output the first output signal according to a control signal.

20. The memory storage device according to claim 19, wherein the memory control circuit unit is further configured for:
  sampling a first indication signal from the memory controller based on a first transition point of the reference clock signal to generate the address signal, and
  sampling a second indication signal from the memory controller based on a second transition point of the reference clock signal to generate the command signal,
  wherein the first transition point is one of a rising edge and a falling edge of the reference clock signal, and the second transition point is the other one of the rising edge and the falling edge of the reference clock signal.

21. The memory storage device according to claim 19, wherein the memory control circuit unit is further configured for:
  sampling a first indication signal from the memory controller based on a first reference clock signal to generate the address signal, and
  sampling a second indication signal from the memory controller based on a second reference clock signal to generate the command signal,
  wherein the first reference clock signal is inverted from the second reference clock signal.

22. The memory storage device according to claim 19, wherein the memory control circuit unit further comprises:
  a second sampling circuit, coupled to the first sampling circuit and the multiplexer and configured to sample the indication signal from the memory controller according to an inverted signal of the reference clock signal and generate a second output signal, wherein
  the multiplexer is further configured to output the second output signal according to the control signal.

23. A signal generation method for a memory control circuit unit to communicate with a volatile memory module, and the signal generation method comprises:
  providing an address signal and a command signal to the volatile memory module;
  sampling an indication signal from a memory controller according to a reference clock signal and generate a first output signal; and
  outputting the first output signal according to a control signal,
  wherein a transmission cycle of the address signal is greater than a transmission cycle of the command signal.

24. The signal generation method according to claim 23, further comprising:
  sampling a first indication signal from the memory controller based on a first transition point of the reference clock signal to generate the address signal; and
  sampling a second indication signal from the memory controller based on a second transition point of the reference clock signal to generate the command signal,
  wherein the first transition point is one of a rising edge and a falling edge of the reference clock signal, and the second transition point is the other one of the rising edge and the falling edge of the reference clock signal.

25. The signal generation method according to claim 23, further comprising:
  sampling a first indication signal from the memory controller based on a first reference clock signal to generate the address signal; and
  sampling a second indication signal from the memory controller based on a second reference clock signal to generate the command signal,
  wherein the first reference clock signal is inverted from the second reference clock signal.

* * * * *